United States Patent
Huang

(10) Patent No.: US 6,320,525 B1
(45) Date of Patent: Nov. 20, 2001

(54) ANALOG-TO-DIGITAL LEVEL ERROR AUTOMATIC CALIBRATION CIRCUIT

(75) Inventor: Te-Hsun Huang, Hsinchu Hsien (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/482,297

(22) Filed: Jan. 12, 2000

(51) Int. Cl.$^7$ ..................................................... H03M 1/10
(52) U.S. Cl. ................................................. 341/120; 341/118
(58) Field of Search ..................................... 341/120, 121, 341/126, 155, 156, 158, 116, 118, 119, 139, 140, 115, 114

(56) References Cited

U.S. PATENT DOCUMENTS

| | | | |
|---|---|---|---|
| 4,947,168 | * | 8/1990 | Myers ................................... 341/120 |
| 5,248,970 | * | 9/1993 | Sooch et al. ......................... 341/120 |

* cited by examiner

Primary Examiner—Brian Young
Assistant Examiner—John Nguyen
(74) Attorney, Agent, or Firm—Jiawei Huang; J.C. Patents

(57) ABSTRACT

Provided is an analog-to-digital level error automatic calibration circuit according to the invention. The analog-to-digital level error automatic calibration circuit includes a calibration switch circuit, an input buffer circuit, an error differential amplifying circuit, an N-bit analog-to-digital converter, a calibration register and a subtractor. The differential amplifying circuit receives and amplifies an external sense voltage or a calibration voltage so as to generate a first error amplifying voltage or a second error amplifying voltage. The first and second error amplifying voltages are converted to a first digital value and a second digital value, respectively. Thereafter, the second digital value is subtracted from the first digital value by the subtractor to generate a converted value without taking an offset voltage of an operational amplifier into calculation.

13 Claims, 4 Drawing Sheets

ANALOG-TO-DIGITAL LEVEL ERROR AUTOMATIC CALIBRATION CIRCUIT

BACKGROUND OF THE INVENTION

1. Field of the Invention

The invention relates to an automatic calibration circuit, and in particular to an automatic calibration circuit for eliminating an offset voltage of an operational amplifier.

2. Description of the Related Art

Usually, an offset voltage with several millivolts exists in an operational amplifier due to errors during circuit layout and manufacturing process. Basically, an operational amplifier includes a pair of differential transistors. Since it is difficult to manufacture two identical transistors, an offset voltage is caused.

When it is necessary to convert a small input voltage, such as several millivolts, up to about one hundred microvolts or several hundred microvolts into a digital signal, a differential amplifier must amplify the small input voltage in advance. For example, using an analog-to-digital converter for 9-bit conversion with a least significant bit (LSB) equal to 4 mV, when the variation of temperature to voltage of a transistor is dV/dT=−2 mV, the input voltage is required to be amplified if the resolution of temperature is only 2° C. while a sensitivity of 0.1° C. is required for the converter. In this case, the amplifier used to amplify input voltage should have a gain of 20 to meet the resolution of 0.1° C.

However, the amplifier amplifies not only the input voltage, but also its own offset voltage when used. Moreover, if the gain of the amplifier is much larger, the offset voltage is further amplified to a very large voltage value, resulting in an output distortion. For example, when the amplifier has an offset voltage of 5 mA and a gain of 10 (i.e., the input voltage can be amplified 10 times), the output voltage of the amplifier is $V_o=10(V_i+5)=10V_i+50$, wherein $V_i$ represents a differential input voltage. Obviously, the offset voltage of 5 mV is amplified to 50 mV. Additionally, when the output voltage $V_o$ is input to an analog-to-digital converter, a conversion error on the LSB is caused to create a distortion.

For this reason, the prior converter is limited only to less than a 9-bit conversion. If it is necessary to use an analog-to-digital converter for more than a 9-bit conversion, the prior amplifier formed using a single poly gate structure fails to achieve this purpose. In other words, it is necessary to adopt a double poly gate structure or a no-overlap switch capacitor to achieve this purpose. However, these solutions increase IC manufacturing costs, complexity of circuit layout and difficulty in circuit designs.

SUMMARY OF THE INVENTION

In view of the above, an object of the invention is to provide an analog-to-digital level error automatic calibration circuit for eliminating an amplified offset voltage of an operational amplifier.

Another object of the invention is to provide an analog-to-digital level error automatic calibration circuit which can exactly implement a more than 9-bit data conversion without any distortions.

To achieve the above stated objects, an analog-to-digital level error automatic calibration circuit according to the invention includes a calibration switch circuit, an input buffer circuit, an error differential amplifying circuit, an N-bit analog-to-digital converter, a calibration register and a subtractor. The calibration switch circuit receives an external sense voltage, and transmits the sense voltage or a calibration voltage depending on whether a calibration enable signal is provided or not.

The input buffer circuit together with the error differential amplifying circuit receives and amplifies the sense voltage or the calibration voltage, thereby generating a first error amplified voltage or a second error amplified voltage. Then, the first error amplified voltage or the second error amplified error voltage is converted by the N-bit analog-to-digital converter. The second error amplified voltage generated in response to the calibration voltage is converted by the N-bit analog-to-digital converter, and then is stored in the calibration register. Thereafter, the second error amplified voltage is subtracted from the first error amplified voltage using the subtractor so as to generate a converted value without taking an offset voltage of an operational amplifier into calculation, thereby automatically eliminating the offset voltage.

As described above, the automatic calibration method can efficiently eliminate the offset voltage of the operational amplifier in coordination with a simple circuit without changing the existing manufacturing process.

BRIEF DESCRIPTION OF THE DRAWINGS

The invention will become more fully understood from the detailed description given hereinbelow and the accompanying drawings which are given by way of illustration only, and thus do not limit the present invention, and wherein.

DETAILED DESCRIPTION OF THE PREFERRED EMBODIMENT

Figure 1:
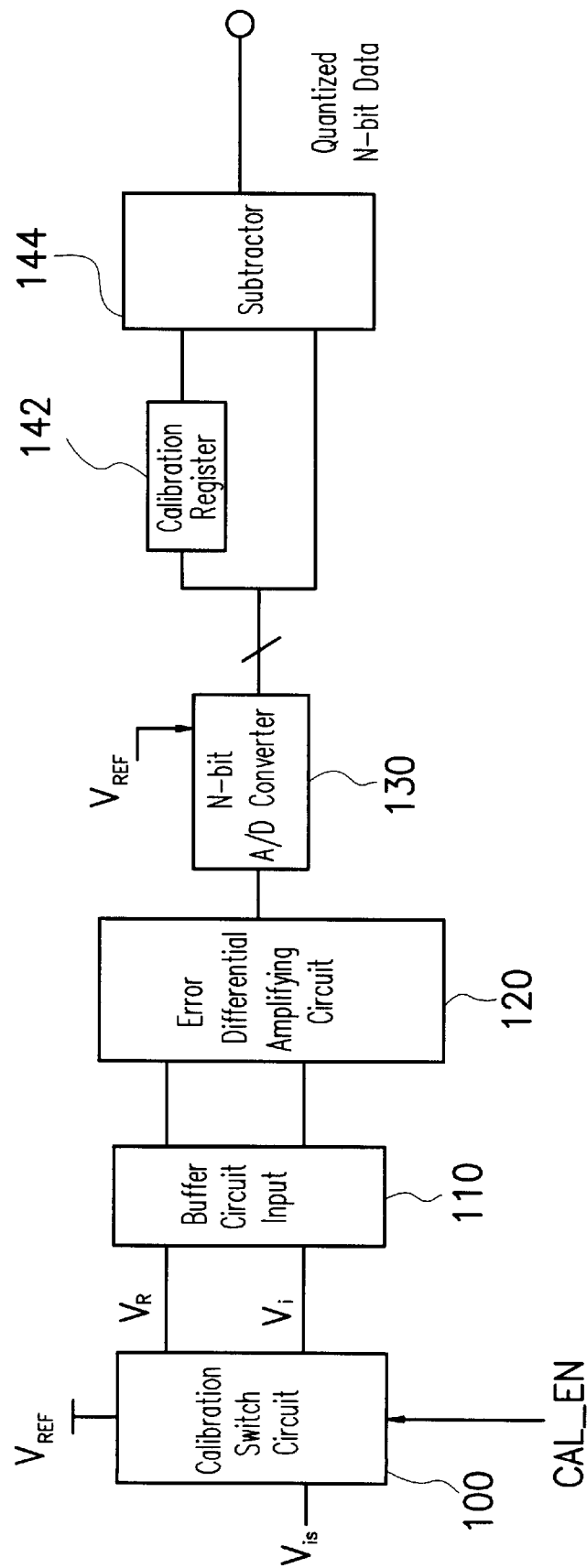
FIG. 1 is a block circuit diagram showing an analog-to-digital level error automatic calibration circuit according to a preferred embodiment of the invention.

FIG. 1 is a block circuit diagram showing an analog-to-digital level error automatic calibration circuit according to a preferred embodiment of the invention. Referring to FIG. 1, the automatic calibration circuit includes a calibration switch circuit 100, an input buffer circuit 110, an error differential amplifying circuit 120, an N-bit analog-to-digital converter 130, a calibration register 142 and a subtractor 144. The calibration switch circuit 100 receives an external sense voltage $V_{is}$, and transmits the sense voltage $V_{is}$ or a calibration voltage $V_{CAL}$ according to whether a calibration enable signal CAL_EN is provided. The input buffer circuit 110 together with the error differential amplifying circuit 120 receives and amplifies the sense voltage $V_{is}$ or the calibration voltage $V_{CAL}$ so as to generate a first error amplifying voltage or a second amplifying voltage. Subsequently, the first or second error amplifying voltage is converted to a first digital value or a second digital value by the N-bit analog-to-digital converter 130. The second error amplifying voltage generated in response to the calibration voltage $V_{CAL}$ is converted to the second digital value which is stored in the calibration register 142. Next, the second digital value is subtracted from the first digital value by the subtractor 144 to generate a converted value without taking an offset voltage of an operational amplifier into calculation, thereby achieving an automatic offset voltage calibration.

Figure 2:
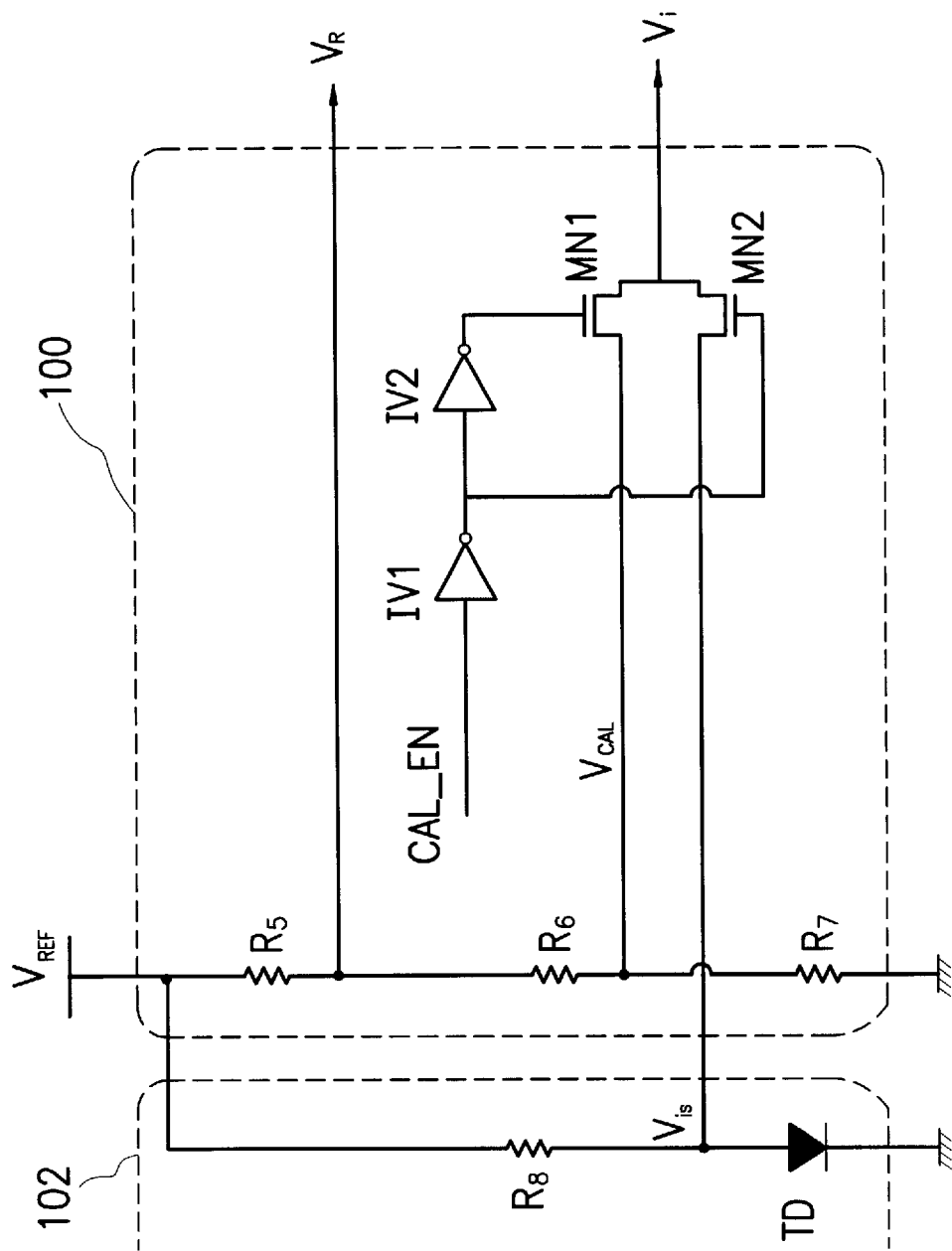
FIG. 2 is a circuit diagram showing a reference voltage and a calibration switch circuit of FIG. 1.

FIG. 2 is a circuit diagram showing the calibration switch circuit 100 of FIG. 1. As shown in FIG. 2, the calibration circuit 100 receives a reference voltage $V_{REF}$ and the second voltage $V_{is}$, wherein the sense voltage $V_{is}$ is provided by a thermal diode TD in an external circuit 102. Also, the sense voltage $V_{is}$ can be provided by a transistor or a thermal diode which is included in a CPU, such as a Pentium II-based CPU.

A reference output voltage $V_R$ and the calibration voltage $V_{CAL}$ are generated in the calibration switch circuit 100, wherein the reference output voltage $V_R$ is equal to the reference voltage $V_{REF}$ minus a voltage drop on a resistor $R_5$ while the calibration voltage $V_{CAL}$ is equal to the reference voltage $V_R$ minus a voltage drop on the resistor $R_5$ and a resistor $R_6$. The calibration switch circuit 100 only selects one of the calibration voltage $V_{CAL}$ and the sense voltage $V_{is}$ as an output voltage $V_i$ according to whether the calibration enable signal CAL_EN is received or not. When the calibration enable signal CAL_EN is provided, the reference output voltage $V_R$ and the calibration voltage $V_{CAL}$ are output. On the contrary, when the calibration enable signal is not provided, the reference output voltage $V_R$ and the external sense voltage $V_{is}$ are output.

Selecting one of the calibration voltage $V_{CAL}$ and the sense voltage $V_{is}$ to serve as the output voltage $V_i$ of the calibration switch circuit 100 can be implemented by a switch circuit consisting of inverters IV1, IV2 and transistors MN1, MN2. When the calibration enable signal CAL_EN is provided, the output of the inverter IV1 enables the transistor MN2 to turn on, and then is inverted by the inverter IV2 to turn on the transistor MN1. At this time, the calibration voltage $V_{CAL}$ is selected as the output voltage $V_i$ of the calibration switch circuit 100. Inversely, the sense voltage $V_{is}$ is the selected as the output voltage $V_i$ if the calibration enable signal CAL_EN is not provided.

Figure 3:
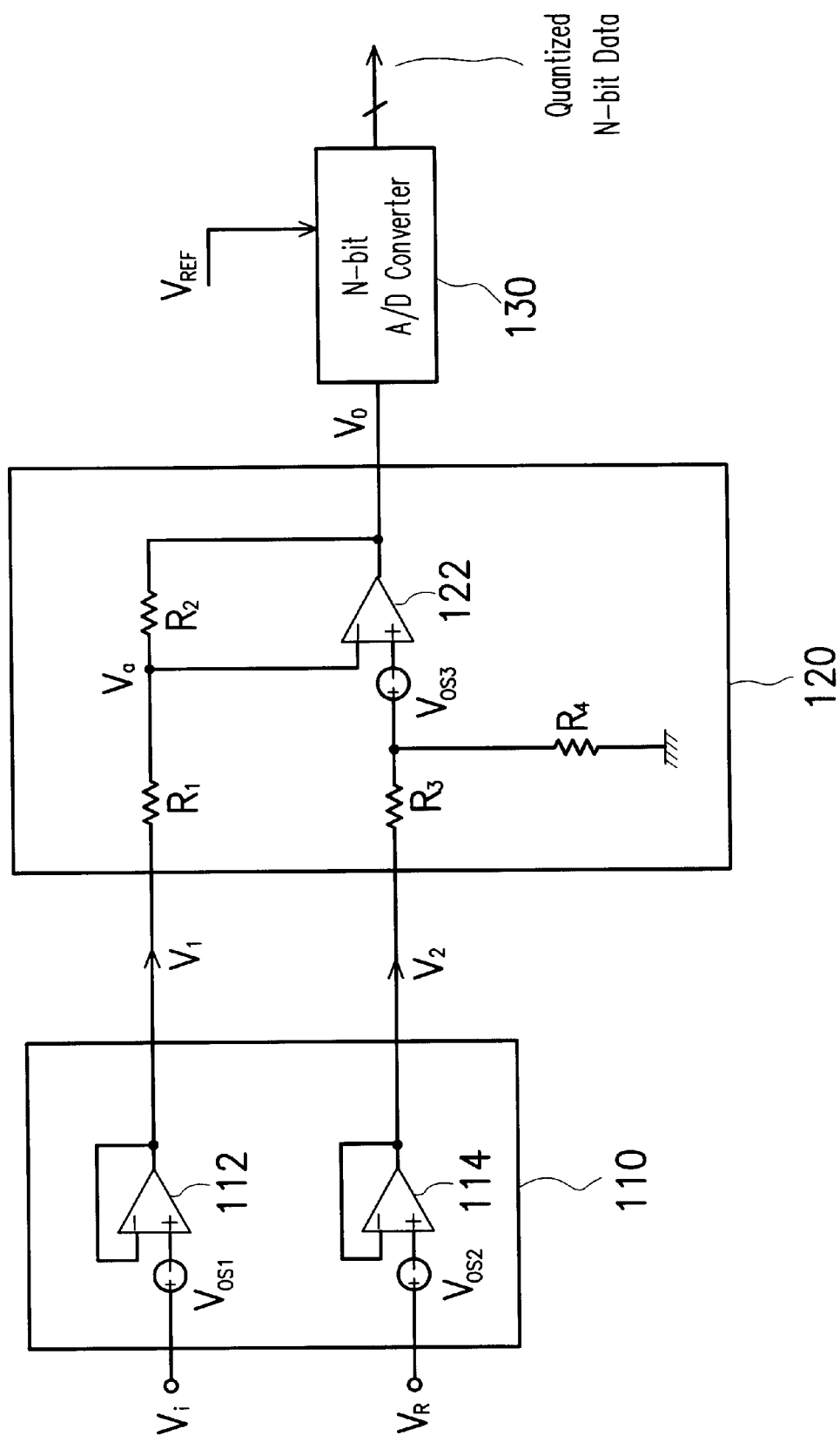
FIG. 3 is a circuit diagram showing an error differential amplifying circuit and an input buffer circuit of FIG. 1.

FIG. 3 is a circuit diagram showing the error differential amplifying circuit 120 and the input buffer circuit 110 of the analog-to-digital level error automatic calibration circuit of FIG. 1. The input buffer circuit 110 includes two operational amplifiers 112,114 for receiving the reference output voltage $V_R$ and the output voltage $V_i$ which are output from the calibration switch circuit 100, wherein the output voltage $V_i$ comprises the calibration voltage $V_{CAL}$ and the sense voltage $V_{is}$. Due to errors made during the manufacturing process and/or circuit layout, the operational amplifiers 112, 114 have offset voltages $V_{os1}$, $V_{os2}$. Assume that the operational amplifiers 112, 114 each has a very large gain, and therefore, the output voltages thereof are $V_1=(V_i+V_{os1})$ and $V_2=(V_R+V_{os2})$, respectively. The operational amplifiers 112, 114 function as buffers for the output voltages $V_i$, $V_R$ of the calibration switch circuit 100, thereby preventing drop voltages from being created on resistors R1–R4 in the error differential amplifying circuit 120.

Under an ideal condition, i.e., an operational amplifier 122 in the error differential amplifying circuit 120 does not have an offset voltage $V_{os3}$, the output voltage of the error differential amplifier circuit 120 is $V_o=(V_2-V_1)\times R_2/R_1$. However, when the offset voltage $V_{os3}$ of the operational amplifier 122 is taken into a consideration, the output voltage of the error differential amplifying circuit 120 is $V_o=[V_b-(V_i+V_{os1})]\times R_2/R_1+V_b$, wherein $V_b=(V_r+V_{os2})\times R_2/(R_1+R_2)+V_{os3}$. Finally, the output voltage $V_o$ can be given by:

$$V_o=(V_R-Vi)\times R_2/R_1+K,$$

wherein $$K=(V_{os2}-V_{os1})\times R_2/R_1+V_{os3}\times R_2/(R_1+R_2)$$

Moreover, the output voltage Vo is quantized by the N-bit analog-to-digital converter 130. This operation is represented by Q[X], wherein the X denotes a converted formula. When the output voltage $V_i$ is the external sense voltage $V_{is}$, the quantized output voltage $Q[V_o]=Q[(V_R-V_{is})\times R_2/R_1+K]=Q[(V_R-V_{is})\times R_2/R_1]+Q[K]$ or $Q[(V_R-V_{is})\times R_2/R_1]+Q[K]+1$, called a first digital value.

Similarly, when a known calibration voltage $V_{CAL}$ is selected for an analog-to-digital conversion, the output voltage $V_o=(V_R-V_{CAL})\times R_2/R_1+K$, and the quantized output voltage is $Q[V_o]=Q[(V_R-V_{CAL})\times R_2/R_1+K]=Q[[(V_R-V_{CAL})\times R_2/R_1]+Q[K]$ or $Q[(V_R-V_{CAL})\times R_2/R_1]+Q[K]+1$, called a second digital value.

Subsequently, the second digital value is subtracted from the first digital value to obtain $QDIFF=Q[(V_R-V_i)\times R_2/R_1]-Q[(V_R-V_{CAL})\times R_2/R_1]+Y$, wherein Y=1, 0 or –1. As a result, the quantized value Q[K], an error caused by the offset voltage, is removed. That is, the amplified offset voltage induced by the error differential amplifier 122 is eliminated. Accordingly, the amplified offset voltage can be eliminated by subtracting the second digital value from the first digital value by a subtractor 144.

Figure 4:
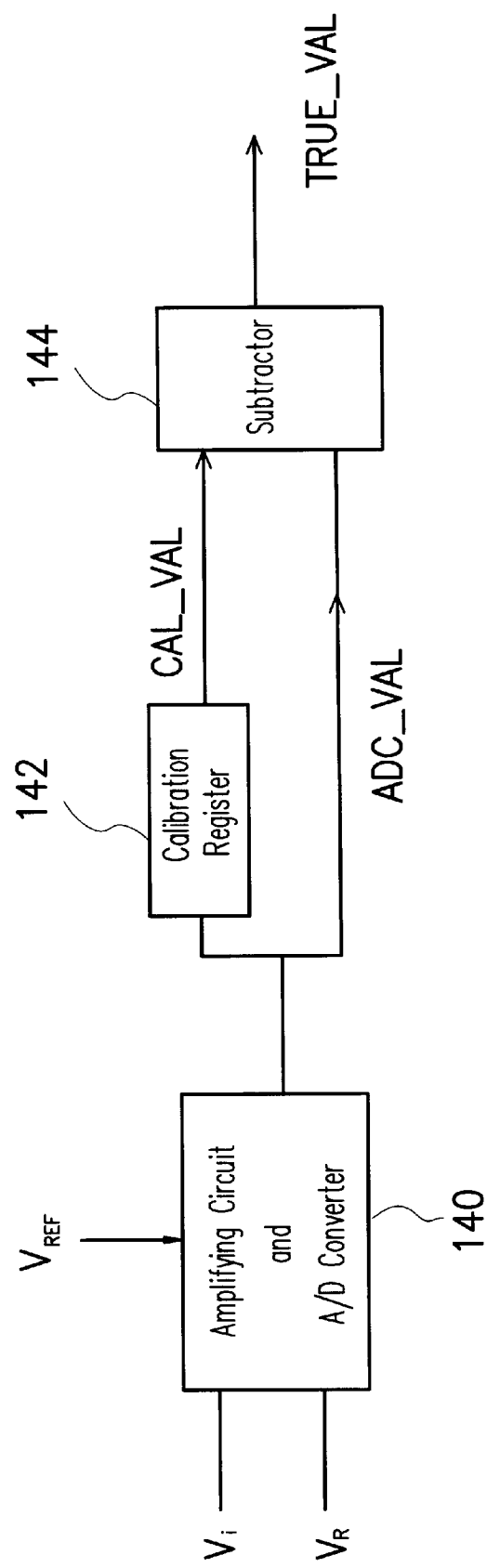
FIG. 4 is block circuit diagram showing a calibration value and a converted value of the calibration circuit of FIG. 1.

FIG. 4 is a block circuit diagram showing a calibration value and a converted value of the calibration circuit of FIG. 1. Referring to FIG. 4, $(V_R-V_{CAL})\times R_2/R_1$ is known and can be obtained from the calibration switch circuit 100 prior to an analog-to-digital conversion. A value CAL_VAL, i.e., $Q[(V_R-V_{CAL})\times R_2/R_1]+Q[K]$ or $Q[(V_R-V_{CAL})\times R_2/R_1]+Q[K]+1$, is stored in the calibration register 142. When the analog-to-digital converter 130 operates normally (the output voltage $V_i$ is the external sense voltage $V_{is}$), an obtained value ADC_VAL is $Q[(V_R-V_{is})\times R_2/R_1]+Q[K]$ or $Q[(V_R-V_{is})\times R_2/R_1]+Q[K]1$. At this point, the ADC_VAL is subtracted from the CAL_VAL value by the subtractor 144 so as to output a correct analog-to-digital converted value TRUE_VAL.

In summary, a feature of the invention is that the offset voltage of an operational amplifier is converted to a digital value using a calibration voltage. The digital value is subtracted from an actual sense voltage converted value. Therefore, the amplified offset voltage can be eliminated.

Another feature of the invention is that current, existing process technology can be used for a precise, more than 9-bit data conversion without distortions and additionally designing a new process.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What claimed is:

1. An analog-to-digital level error automatic calibration circuit comprising:

a calibration switch circuit for receiving a reference voltage and an external sense voltage and transmitting a reference output voltage and a calibration voltage by dividing the reference voltage;

an input buffer circuit for receiving one of the reference output voltage, the calibration voltage and the external sense voltage output from the calibration switch circuit;

an error differential amplifying circuit for receiving and amplifying the output voltage of the input buffer circuit, and transmitting a first error amplifying voltage when the output voltage is the external sense voltage or a second error amplifying voltage when the output voltage is the calibration voltage;

an N-bit analog-to-digital converter electrically coupled to the output terminal of the error differential amplifying circuit for converting the first error amplifying voltage and the second error amplifying voltage into a first digital value and a second digital value;

a calibration register electrically coupled to the N-bit analog-to-digital converter for storing the second digital value; and a subtractor for receiving the first digital value and the second digital value, and transmitting a result value obtained by subtracting the second digital value from the first digital value.

2. The analog-to-digital level error automatic calibration circuit of claim 1, wherein the calibration switch circuit outputs the reference output voltage and the calibration voltage when enabled and outputs the reference output voltage and the external sense voltage when disabled.

3. The analog-to-digital level error automatic calibration circuit of claim 1, wherein the external sense voltage is generated by a thermal diode.

4. The analog-to-digital level error automatic calibration circuit of claim 1, wherein the external sense voltage is generated by a transistor.

5. The analog-to-digital level error automatic calibration circuit of claim 1, wherein the external sense voltage is generated by a CPU.

6. The analog-to-digital level error automatic calibration circuit of claim 1, wherein the calibration switch circuit, the input buffer circuit and the error differential amplifying circuit are integrated in an integrated circuit.

7. An analog-to-digital level error automatic calibration circuit of claim 1, wherein the input buffer circuit comprises operational amplifiers.

8. An analog-to-digital level error automatic calibration circuit comprising:

a calibration switch circuit for receiving a reference voltage and an external sense voltage and transmitting a reference output voltage and a calibration voltage by dividing the reference voltage;

an differential amplifying/digital converting circuit for receiving and amplifying the output voltage of the calibration switch circuit and transmitting a first digital value when the output voltage is the external sense voltage or a second digital value when the output voltage is the calibration voltage; and a subtractor for receiving the first digital value and the second digital value, and transmitting a result value by subtracting the second digital value from the first digital value.

9. The analog-to-digital level error automatic calibration circuit of claim 8, wherein the calibration switch circuit outputs the reference output voltage and the calibration voltage when enabled and outputs the reference output voltage and the external sense voltage when disabled.

10. The analog-to-digital level error automatic calibration circuit of claim 8, wherein the external sense voltage is generated by a thermal diode.

11. The analog-to-digital level error automatic calibration circuit of claim 8, wherein the external sense voltage is generated by a transistor.

12. The analog-to-digital level error automatic calibration circuit of claim 8, wherein the external sense voltage is generated by a CPU.

13. A method for level error automatic calibration comprising the steps of:

amplifying an external sense voltage and a calibration voltage;

converting the amplified external sense voltage and the calibration voltage to a first digital value and a second digital value; and outputting a result value by subtracting the second digital value from the first digital value.

* * * * *